United States Patent
Chesire et al.

[11] Patent Number: 6,153,543
[45] Date of Patent: Nov. 28, 2000

[54] HIGH DENSITY PLASMA PASSIVATION LAYER AND METHOD OF APPLICATION

[75] Inventors: Daniel P. Chesire; Edward P. Martin, Jr.; Leonard J. Olmer; Barbara D. Kotzias, all of Orlando; Rafael N. Barba, Apopka, all of Fla.

[73] Assignee: Lucent Technologies Inc., Murray Hill, N.J.

[21] Appl. No.: 09/370,422

[22] Filed: Aug. 9, 1999

[51] Int. Cl.⁷ ........................ H01L 21/4763; H01L 21/31
[52] U.S. Cl. ........................... 438/791; 438/624; 438/787
[58] Field of Search ................................... 438/763, 787, 438/791, 624

[56] References Cited

U.S. PATENT DOCUMENTS

| | | | |
|---|---|---|---|
| 5,716,888 | 2/1998 | Lur et al. | 438/619 |
| 5,804,259 | 9/1998 | Robles | 427/577 |
| 5,937,323 | 8/1999 | Orezyk et al. | 438/624 |
| 5,968,610 | 10/1999 | Liu et al. | 427/579 |

OTHER PUBLICATIONS

Nguyen, S.V., "High–Density Plasma Chemical Vapor Deposition of Silicon–Based Dielectric Films for Integrated Circuits," *IBM Journal of Research & Development*, vol. 43, No. 1/2 (1998). no month.

*Primary Examiner*—John F. Niebling
*Assistant Examiner*—Alexander G. Ghyka

[57] ABSTRACT

A method of forming a passivation layer over features located on a top layer on a semiconductor device comprises depositing a first void-free layer of a dielectric over the top layer using high density plasma chemical vapor deposition. A second void-free layer can additionally be deposited over the first void-free layer. The first void-free layer can be formed from a silicon oxide, and the second void-free layer can be formed from a silicon nitride. The first void-free layer has a top surface that is disposed at a height higher than the features. The first void-free layer can be applied in two steps. First, the void-free layer is deposited at a D/S ratio between 3.0 and 4.0 to a depth of at least 40% of the feature's height, and then deposited at a D/S ratio of between 6.0 and 7.0.

9 Claims, 1 Drawing Sheet

HIGH DENSITY PLASMA PASSIVATION LAYER AND METHOD OF APPLICATION

CROSS-REFERENCE TO RELATED APPLICATION

Not Applicable

STATEMENT REGARDING FEDERALLY SPONSORED RESEARCH AND DEVELOPMENT

Not Applicable

FIELD OF THE INVENTION

This invention relates to the manufacturing of semiconductors. More specifically, the invention relates to a high density plasma passivation layer and method of application that provides a cap over the top layer of a semiconductor device.

BACKGROUND OF THE INVENTION

During the manufacturing of semiconductor devices, layers of dielectrics and metal are added onto a wafer until a final layer of metal is added, hereinafter referred to as the top metal level or layer. Over this top metal layer is typically placed a barrier, passivation or CAPS (Coat and Protective Seal) layer. This passivation layer acts to maintain the mechanical integrity of the semiconductor device, prevent mobile ion diffusion, and provide some radiation protection for the semiconductor device.

Several types of methods for applying passivation layers over a top metal layer have been used in the semiconductor industry. One such passivation level is a bi-layer in which the bottom layer is a silicon dioxide and the top layer is a silicon nitride. The silicon dioxide layer is flexible and acts as a buffer to relieve stress between the silicon nitride and the top metal layer. Thus, this bottom layer reduces the impact of the mechanisms that result in the stress void migration of the metal and also acts as a mechanical protector for the underlying structures. Although the top silicon nitride layer is more brittle, the silicon nitride layer has the advantage of being resistant to moisture and sodium penetration. Additionally, the bi-layer structure inherently eliminates the coincident occurrence of pin-hole defects.

One method of applying the silicon dioxide layer of this particular bi-layer passivation level is to use plasma enhanced chemical vapor deposition (PECVD) with tetraethlorthosilicate (TEOS) chemistry. The use of TEOS chemistry advantageously results in superior film step coverage over the patterned metal-interconnects (runners) of the top metal layer as compared to silicon nitride.

As illustrated in FIG. 1, the current methods of applying passivation layers 6 are capable of filling the gap between adjacent features 4, such as the runners, when the distance between the features is large. However, FIG. 2 illustrates a problem with current methods, including TEOS chemistry. This problem is that the gap cannot be filled as the size of features and gaps becomes smaller. These unfilled gaps subsequently become voids 8 in the passivation layer. The existence of these voids can cause reliability problems due to entrapment of gases or liquids in the voids. Also, these voids can act as stress raisers, which can result in inferior mechanical strength of the passivation layer and allow metal interconnects to stress relieve into the voids.

The inferior mechanical strength caused by the voids can be a problem when the chip is removed from the wafer and pressed into the die assembly or other chip carrier. This pressing of the chip transmits a significant force to the passivation level of the chip. A common result of such a transmission of force is damage to the runners in the top metal layer. This damage can be even more prevalent when the runners have high aspect ratios such that the height dimension is significantly greater than the width dimension. Features having this type of aspect ratio are more susceptible to a force applied in the vertical or transverse direction, which occurs when the chip is pressed. One method of compensating for the voids has been to provide a very thick passivation level. However, a thick passivation level, besides being more costly, does not solve the problems associated with the voids.

Although the previously discussed passivation layer is one type of passivation layer used in the semiconductor industry, other passivation layers are also used. Once such passivation layer is formed from polymers or other plastic-like materials. Passivation layers formed from these plastics suffer from many problems. For example, plastic contains many organic compounds which may contaminate the semiconductor device. Some of these compounds are not stable at the temperatures required for the board solder assembly process. Also, these plastic-like materials tend to absorb excessive moisture, which can also contaminate the semiconductor device and cause device degradation and interfacial damage in a package environment.

A recently introduced process to apply oxides on semiconductor devices is high density plasma chemical vapor deposition (HDP CVD). This process is described by S. V. Nguyen, "High-Density Plasma Chemical Vapor Deposition of Silicon-Based Dielectric Films for Integrated Circuits," in *IBM Journal of Research & Development*, Vol. 43, No. ½ (1998) and is incorporated by reference herein.

HDP CVD has been used to fill and locally planarize high-aspect-ratio (i.e., up to 4:1) sub-half-micron structures. Generally with HDP CVD, ions and electrons are generated by means of an rf power source. Also, a rf biasing power source is applied to an electrode holding the wafer to create a significant ion bombardment (sputter-etching) during deposition. As such, when HDP CVD is used for gap filling, this is a technique in which deposited films are sputtered off by reactive ions and radicals during deposition.

The deposition/sputtering-rate ratio (D/S) is a commonly used measure of the gap-filling capability of the process. This ratio is defined as:

D/S=(net deposition rate+blanket sputtering rate)/blanket sputtering rate.

In general, the use of a lower D/S ratio facilitates the filling of a structure with a higher aspect ratio, but at a lower net deposition rate.

A typical HDP CVD process uses a relatively low pressure of 2–10 mTorr to achieve a high electron density ($10^{10}$–$10^{12}$ cm$^3$) and a high fractional ionization rate ($10^{-4}$ to $10^{-1}$). As a high film-deposition rate is required for most applications, the process typically uses simple initial reactant gases such as silane, silicon tetrafluoride, and oxygen. Argon is added to raise the sputter rate due to its large mass. To achieve a significant deposition rate while maintaining a reasonably high sputter-etching rate for gap-filling purposes, a significant amount of initial reactant (i.e., deposited species in the plasma) must flow through the reactor. However, the system should be kept at low pressure constantly during deposition to facilitate high sputter rates. Therefore, the vacuum system for such a system typically has a high pumping capability. Also, the pumping system is generally designed to withstand the high temperature and high reactivity of the reaction by-products while removing them at a high rate. For an HDP CVD system, an advanced turbomolecular pump is generally required to achieve a suitable gap fill rate (at low pressure) and acceptable pumping reliability As previously stated, the use of HDP CVD of silicon oxide, particularly during high rf biasing gap-fill conditions, produces simultaneous deposition and etching. This result has been used to provide void-free gap fill during the processing of semiconductor devices. Current developments in HDP CVD are working to provide void-free gap fill of high-aspect-ratio (>2:1) sub-half-micron structures. However, these techniques have generally been limited to interlevel insulation, gate conductors, and shallow-trench isolation structures and has not been used to apply a dielectric layer to a top metal layer.

SUMMARY OF THE INVENTION

It is therefore an object of the invention to provide a passivation layer and method of applying the passivation layer capable of filling voids and gaps between closely spaced features such as metal runners disposed on the top metal layer of a semiconductor device.

It is another object of the invention to provide a passivation layer and method of applying the passivation layer that prevents damage of the top metal layer of a semiconductor device from moisture, mobile ions, and radiation.

It is yet another object of the invention to provide a passivation layer and method of applying the passivation layer, the passivation layer providing excellent mechanical protection against mechanical damage during the assembly and plastic encapsulation of the semiconductor device.

It is a further object of the invention to provide a passivation layer and method of applying the passivation layer that places the dominant and transverse stress gradients above the surface of the top metal layer.

These and other objects of the invention are achieved by the subject method which comprises depositing a first void-free layer of a dielectric over the top layer using high density plasma chemical vapor deposition. This passivation layer acts to protect the top layer of the semiconductor device. Additional layers, including a second void-free layer, can also be deposited over the first void-free layer to provide additional protection for the semiconductor device and the top layer.

The first void-free layer is preferably formed from a silicon oxide, and the second void-free layer is preferably formed from a silicon nitride. Also, the first void-free layer has a top surface that is disposed at a height higher than the features. By having the first void-free layer positioned above the features, cracks propagating through layers disposed on top of the first void-free layer will end at a height above the features. This advantageously keeps the stress gradient created by the crack above the level of the features.

The first void-free layer can be applied in two steps. First, the void-free layer is preferably deposited at a D/S ratio of between approximately 3.0 and 4.0 to a depth of at least 40% of the feature's height. In this manner, gaps between the features can be sufficiently filled before the second step. During the second step, the void-free layer is preferably deposited at a higher D/S ratio of between approximately 6.0 and 7.0. This higher D/S ratio allows the void-free layer to be deposited at a higher rate, which increases the thruput of the process.

BRIEF DESCRIPTION OF THE DRAWINGS

There are shown in the drawings embodiments of the invention that are presently preferred, it being understood, however, that the invention is not limited to the precise arrangements and instrumentalities shown.

DETAILED DESCRIPTION OF THE PREFERRED EMBODIMENTS

Figure 3:
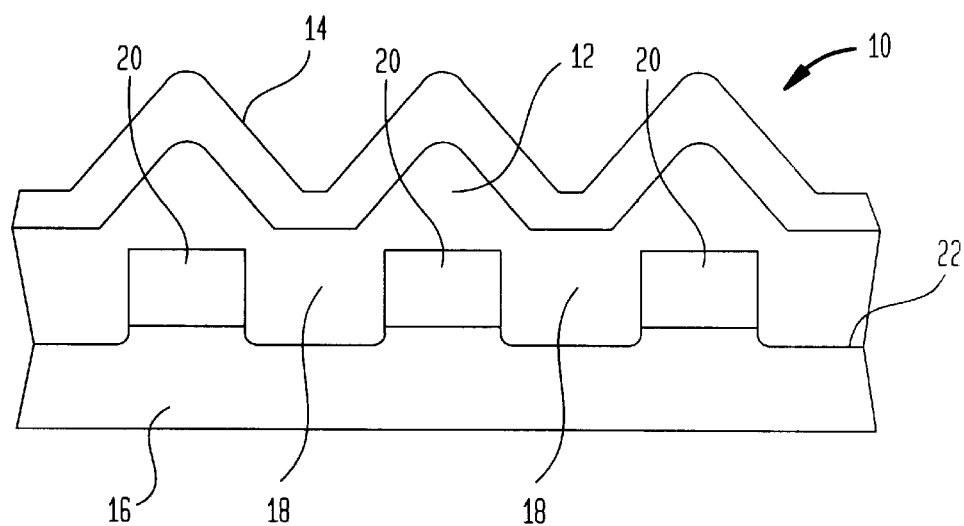
FIG. 3 illustrates a passivation layer disposed over a top metal layer of a semiconductor device according to the invention.

Referring to FIG. 3, a method for applying a passivation layer on a top metal layer of a semiconductor device, according to the present invention, is illustrated. The passivation layer 10 comprises a first layer 12 over a top layer 16 of the semiconductor device. The top layer 16 of a semiconductor device typically includes metal features 20 extending above the surface 22 of the top layer 16. Although the features 20 are typically constructed from electrically conductive materials, for example copper, tungsten, or aluminum, the invention is not limited in this regard. The invention can also be used to provide a passivation layer 10 over any feature 20 extending above the surface 22 of a top layer 16.

The invention is also not limited as to the size or type of feature 20 on the top layer 16 over which the passivation layer 10 will be deposited. In the semiconductor industry, a typical feature 20 disposed on the top layer 16 is a runner. Although the invention is not limited as to the type of feature over which the passivation layer 10 is deposited, feature 20 is hereinafter referred to as runner 20. Although the runners 20 vary in size, the invention is not limited as to the size of the runner 20 disposed on the top layer 16. However, runners 20 typically have a height measured in the thousands of Angstroms (Å). In a preferred embodiment, the runners 20 over which the passivation layer 10 will be deposited have a height of approximately 8000 Å.

The dimensions of the gap 18 between adjacent runners 20 are important factors in determining the likelihood of void formation, in particular the aspect ratio of the gap 18 (aspect ratio being defined as the height of the gap divided by the width of the gap). As the aspect ratio increases from <1 to >4, applying a passivation layer 10 over the top layer 16 without forming voids using current techniques becomes increasingly difficult. For example, current techniques of applying a barrier layer 10 creates voids when the gap 18 between runners 20 has a dimension of 4000 Å in width and 8000 Å in height (aspect ratio of 2.0).

The current invention is capable of filling gaps 18 having aspect ratios at least as great as 4.0. Although the absolute width of the gap 18 is currently limited by semiconductor manufacturing techniques, the invention is not limited to a minimum width of the gap 18. As manufacturing techniques reduce the minimum width of the gap 18, this invention can still be used to apply a passivation layer 10 over the top layer 16 without the formation of voids.

The passivation layer 10 can perform many functions. These functions can include, but are not limited to acting as a barrier to prevent moisture, mobile ions, and radiation from reaching the top layer 16 and also providing mechanical protection to the top metal layer 20. It is known in the art that a passivation layer 10 with such characteristics can be made from many different materials, for example a dielectric, and this invention is not limited as to a particular material or combination of materials.

The presently preferred passivation layer 10 includes an oxide layer. Although the passivation layer 10 can be formed from other oxides, such as an aluminum oxide, the presently preferred passivation layer 10 includes a layer of a silicon oxide. Most preferably, the first layer 12 of the passivation layer 10 is formed from a silicon oxide, specifically silicon dioxide ($SiO_2$). An advantage of having the first layer 12 formed from silicon dioxide is that silicon dioxide tends to be compliant. In this manner, the first layer 12 can resist deformation caused by a force being transmitted to the first layer 12, which could otherwise cause cracks in the first layer 12 and/or damage the underlying top layers 16 and 20 of the semiconductor device.

The passivation layer 10 can also include subsequent layers disposed over the first layer 12. In a presently preferred embodiment, a second layer 14 is disposed over the first layer 12. This second layer 14 is preferably formed from a silicon nitride. Although a silicon nitride tends to be brittle, forming the second layer 14 from a silicon nitride has the advantage of providing a moisture, mobile ions, and radiation resistant barrier.

The passivation layer 10 can also be constructed with a nitride layer first and then an oxide layer. An additional nitride layer can then be deposited over the oxide layer to form an nitride-oxide-nitride structure. A oxide-nitride-oxide structure is also possible.

Figure 1:
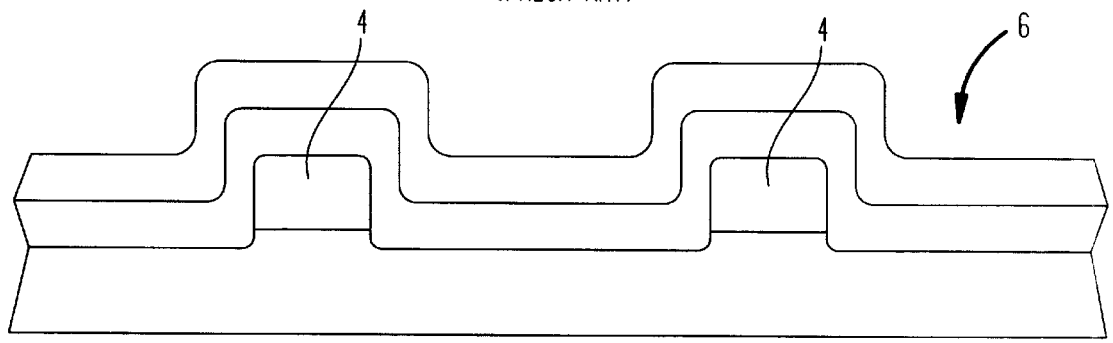
FIG. 1 shows a prior art passivation layer deposited over a top metal layer of a semiconductor device. The semiconductor device has runners spaced apart so that the gap between the runners has a low aspect ratio.
Figure 2:
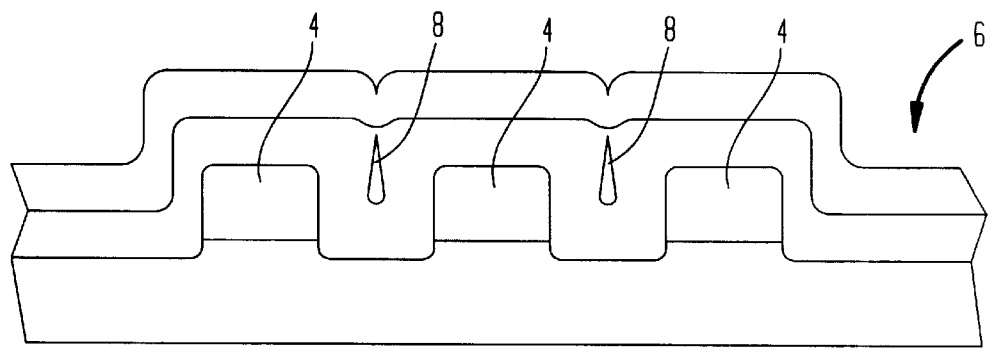
FIG. 2 shows a prior art passivation layer deposited over a top layer of a semiconductor device. The semiconductor device has runners spaced apart so that the gap between the runners has a high aspect ratio.

The first layer 12 can be formed using any process that deposits a layer of dielectric material over the top layer 16. However, the first layer 12 is preferably formed using a HDP CVD process. Advantageously, by using the HDP CVD process, gaps 18 between adjacent features, for example runners 20, in the top layer 16 of the semiconductor device can be filled without the formation of voids. Voids (as best illustrated in FIG. 2) are formed when other deposition processes, for example TEOS, are used and the aspect ratio (height to width) of the gap 22 between two adjacent features 24 is sufficiently large. However, use of the HDP CVD process can be used to fill gaps 18 having high aspect ratios between adjacent runners 20.

The invention is not limited as to the variation in D/S ratio during the application of the first layer 12. For example, the D/S ratio can remain constant during the deposition process. Alternatively, the D/S ratio can be changed multiple times during the deposition process. In a preferred embodiment of the invention, the first layer 12 is applied in two steps. During the first step, the material is deposited using the HDP CVD process and with a relatively small D/S ratio of approximately 3.0–4.0. In this manner, the gap 18 can be at least partially filled. During the second step, the remainder of the material for the first layer 12 is deposited at a higher deposition rate. Although during the second step the material is preferably deposited also using the HDP CVD process, the invention is not limited in this manner. The material could be deposited using other conventional depositing process, for example PECVD TEOS. By using the HDP CVD process for the second step but with a higher D/S ratio, the need to transfer the semiconductor device to another apparatus is advantageously eliminated.

When the HDP CVD process is used to apply the material during the second step, the preferred D/S ratio is approximately 6.0–7.0. By using a higher D/S ratio during the second step than the first step, a higher throughput can be achieved.

The following table illustrates the result of applying the first layer 12 using the aforementioned two-step process. This table shows the effect of varying the depth to which each step deposits the material. For each example, the total depth was approximately 8000 Å of silicon dioxide. The D/S ratio during the first step was 3.0–4.0, and the D/S ratio for the second step was 6.0–7.0. The gap 18 had dimensions of approximately 2100 Å in width and 8000 Å in height.

|  | Example 1 | Example 2 | Example 3 | D/S Ratio |
| --- | --- | --- | --- | --- |
| Step 1 Thickness | 4000Å | 3000Å | 2000Å | 3.0–4.0 |
| Step 2 Thickness | 4000Å | 5000Å | 6000Å | 6.0–7.0 |
| Result | No Voids | No Voids | Voids |  |

As illustrated in the table, the creation of voids in the first layer 12 was prevented when the thickness of the material deposited during the first step exceeded approximately 40% of the height of the gap. As a lower D/S ratio indicates a slower deposition rate, the throughput of the semiconductor device can be increased through the HDP CVD process by maximizing the deposition of material at the highest D/S ratio. Thus, to increase the throughput and prevent formation of voids, the presently preferred two-step process deposits the material in the first layer 12 during the first step to approximately a thickness of 40% of the height of the gap 18.

The deposition of the first layer 12 onto the top layer 16 is not limited to a particular thickness. However, in a preferred embodiment of the invention, the first layer 12 is applied to a thickness at least as great as the height of the runners 20 disposed on the top layer 16. Applying the material to a height above the runners 20 provides better mechanical protection to the runners 20. For example, if a second layer 14 was provided above the first layer 12, and a crack propagated through, the second layer 14, the crack would end at a height above the runners 20. Thus, the stress gradient created by the crack would remain above the level of the runners 20.

It should be understood that the examples and embodiments described herein are for illustrative purposes only and that various modifications or changes in light thereof will be suggested to persons skilled in the art and are to be included within the sprint and purview of this application. The invention can take other specific forms without departing from the spirit or essential attributes thereof for an indication of the scope of the invention.

What is claimed is:

1. A method of forming a passivation layer over features located on a top layer of a semiconductor device, comprising the steps of:

depositing a first void-free layer of a first dielectric over said top layer using high density plasma chemical vapor deposition at a first D/S ratio, and depositing a second void-free layer of a second dielectric over said first void-free layer at a second D/S ratio, wherein said second D/S ratio is greater than said first D/S ratio.

2. The method according to claim 1, wherein said dielectrics are at least one selected from the group consisting of silicon dioxide and silicon nitride.

3. The method according to claim 1, wherein said first D/S ratio is between approximately 3.0 and 4.0 and the second D/S ratio is between approximately 6.0 and 7.0.

4. The method according to claim 1, wherein the sum of thickness of said void free first and second layers is between approximately 8000 Å to 12000 Å.

5. The method according to claim 1, wherein said first layer is applied with a thickness of at least 40% of the height of said features.

6. The method according to claim 1, further comprising the step of depositing a third void-free layer over said second void-free layer.

7. The method according to claim 6, wherein said third void-free layer is a nitride.

8. The method according to claim 7, wherein said nitride is silicon nitride.

9. The method according to claim 6, wherein the sum of said first void-free layer thickness and second void free layer thickness is between approximately 8000 Å to 12000 Å and said third void-free layer has a thickness of between approximately 2600 Å to 3400 Å.

* * * * *